United States Patent
Yanbe et al.

(10) Patent No.: US 8,039,752 B2
(45) Date of Patent: Oct. 18, 2011

(54) HEAT DISSIPATION STRUCTURE OF A PRINT CIRCUIT BOARD

(75) Inventors: Shinya Yanbe, Tochigi (JP); Kazuo Maruyama, Miyagi (JP); Takashi Ikeda, Tochigi (JP); Tetsu Miyamoto, Saitama (JP)

(73) Assignees: Keihin Corporation, Tokyo (JP); Honda Motor Co., Ltd., Tokyo (JP)

( * ) Notice: Subject to any disclaimer, the term of this patent is extended or adjusted under 35 U.S.C. 154(b) by 391 days.

(21) Appl. No.: 12/390,022

(22) Filed: Feb. 20, 2009

(65) Prior Publication Data

US 2009/0211788 A1 Aug. 27, 2009

(30) Foreign Application Priority Data

Feb. 21, 2008 (JP) .................. 2008-039741

(51) Int. Cl.
*H05K 1/00* (2006.01)
(52) U.S. Cl. ...................................... 174/252
(58) Field of Classification Search .............. 174/252, 174/260, 261, 262; 361/704, 720
See application file for complete search history.

(56) References Cited

U.S. PATENT DOCUMENTS 6,188,308 B1 * 2/2001 Kojima et al. .............. 338/22 R
6,438,821 B1 * 8/2002 Kojima et al. .................. 29/612

FOREIGN PATENT DOCUMENTS

JP 2001-168476 A 6/2001
JP 2005-158914 A 6/2005

* cited by examiner

*Primary Examiner* — Javaid Nasri
(74) *Attorney, Agent, or Firm* — Westerman, Hattori, Daniels & Adrian, LLP

(57) ABSTRACT

A heat dissipating structure of a print circuit board to improve heat-dissipation efficiency for mounted electronic components while retaining required soldering strength is disclosed. The heat dissipation structure of a print circuit board comprising a stack of multiple layers including a mounting surface layer on which electronic components including heat generating components are soldered. On both sides of the print circuit board, inner vias bore surface layers but inner layers are not bored. Core vias bore the inner layers in the print circuit board but the surface layers are not bored. The inner vias and the core vias are positioned at the predetermined distance over the layer surface. Heat from heat generating components is conducted through the inner vias on surface layers and the core vias inside the circuit board to the outside, high efficiency of the heat-dissipation is achieved.

2 Claims, 6 Drawing Sheets

FIRST LAYER (THE LOWERMOST LAYER)

FIFTH LAYER

SECOND LAYER

SIXTH LAYER (THE UPPERMOST LAYER)

THIRD AND FOURTH LAYER

FIG.5B PRESENT EMBODIMENT

HEAT DISSIPATION STRUCTURE OF A PRINT CIRCUIT BOARD

INCORPORATION BY REFERENCE

The present application claims the benefit under 35 U.S.C. 119 of Japanese Patent Application No. 2008-039741 filed on Feb. 21, 2008, the disclosure of which is herein incorporated by reference in its entirety.

BACKGROUND OF THE INVENTION

1. Field of the Invention

The present invention relates to a heat dissipation structure of a multilayer print circuit board.

2. Description of the Related Art

In recent years, due to miniaturization and high density packaging of electronic apparatus, heat generation density of an electronic device is increased and the temperature within the electronic device becomes higher than ever before. In order to prevent the temperature from exceeding a permissible temperature range of electronic components in the electronic device, techniques for efficiently dissipating heat from heat generating components have been proposed.

For example, the Japanese Laid-Open Patent Publication JP 2001-168476 discloses a heat dissipation structure with a plurality of through holes which are bored in an area in contact with a heat generating element on an print circuit board, a conductive plating which is applied to inside wall of each through hole, and a heat dissipation element which is equipped with a plurality of holes bored on the rear surface of the print circuit board. The contact area and the through holes are filled with solder and the heat dissipation element is soldered to the through holes.

The Japanese Laid-Open Patent Publication JP 2005-158914 discloses another heat dissipation structure with a heat dissipation pattern formed on a print circuit board to contact heat dissipation pads of an integrated circuit (IC) package, and one or more through holes which are bored through the heat dissipation pattern in this heat dissipation structure and the through holes are filled with a heat conductor like solder.

With the heat dissipation structure which employs through holes as disclosed in both publications JP 2001-168476 and JP 2005-158914, there is a danger of a solder shortage caused by solder leaking, like a cream solder which is described later, leaking out of the through holes when the circuit board is processed in a solder reflow furnace. Therefore, with the heat dissipation structures disclosed in the abovementioned patent publications, a probability for causing a faulty electric connection of electronic components and solder cracks increases due to the solder shortage.

In view of the problem involved, it is an object of the present invention to provide a heat dissipation structure for a print circuit board to improve heat dissipation efficiency while retaining a necessary soldering strength.

SUMMARY OF THE INVENTION

The present invention, in order to achieve the abovementioned object, is a heat dissipation structure of a print circuit board, comprising a print circuit board comprising a plurality of stacked layers constituted by a plurality of outer layers, the outer layers including an uppermost layer and a lower most layer, and a plurality of inner layers, the inner layers disposed between the outer layers, and electric components including a heat generating component, which are mounted on the outer layer, wherein an inner via and a core via are formed in the print circuit board, the inner via which is bored through between the outer layers and not bored through between the inner layers, the core via which is bored through between the inner layers and not bored through between the outer layers, and wherein the core via is disposed a predetermined length apart from the inner via on the stacked layer.

With the above mentioned structure, the electronic components and the print circuited board are electrically connected by solder, and the solder preferably flows into the inner vias which are bored in the outer layers of the print circuit board. These inner vias are stopped with the solder According to the present invention, when the solder, like a cream solder for example, is melted between the electronic components and the print circuit board, the solder flows into the inner vias which are bored through between the outer layers of the print circuit board and not bored through between the inner layers, and the solder is prevented from further flowing by the bottoms of the inner vias. Accordingly the solder is satisfactorily prevented from leaking to the outside.

As a result, the present invention ensures retaining a necessary and sufficient amount of solder on the mounting surface of the print circuit board for connecting the electronic components including heat generating components, thus solder cracks are prevented from being created.

According to the present invention, the heat generated by heat source elements is transferred to the solder-filled inner vias which are bored from on the mounting surface of the print circuit board. Then, the heat is transferred from the inner vias to inner walls and proximity of a core via which are bored through between the inner layers and disposed in the vicinity of the inner via and a predetermined length apart from the inner via. The heat is further transferred to the inner walls of the inner vias which are bored from on the non-mounting surface of the print circuit board and are not filled with solder. As a result, the heat generated from the heat generating components is dissipated through the inner vias and core vias which are disposed a predetermined length apart from each other and is dissipated to the outside, which results in improving heat dissipation efficiency.

The present invention provides a heat dissipation structure of a print circuit board, which is capable of improving heat dissipating efficiency for the mounted electronic components. Additionally, since the solder connecting the electronic components with print circuit board electrically is stopped from flowing out by the inner via, solder leaking to the outside is avoided and the required soldering strength is retained.

BRIEF DESCRIPTION OF THE DRAWINGS

FIG. 5B is a vertical cross sectional view of the print circuit board which has the structure in accordance with the present embodiment showing how the cream solder is coated and electronic components are mounted.

BEST MODE FOR CARRYING OUT THE INVENTION

Figure 1:
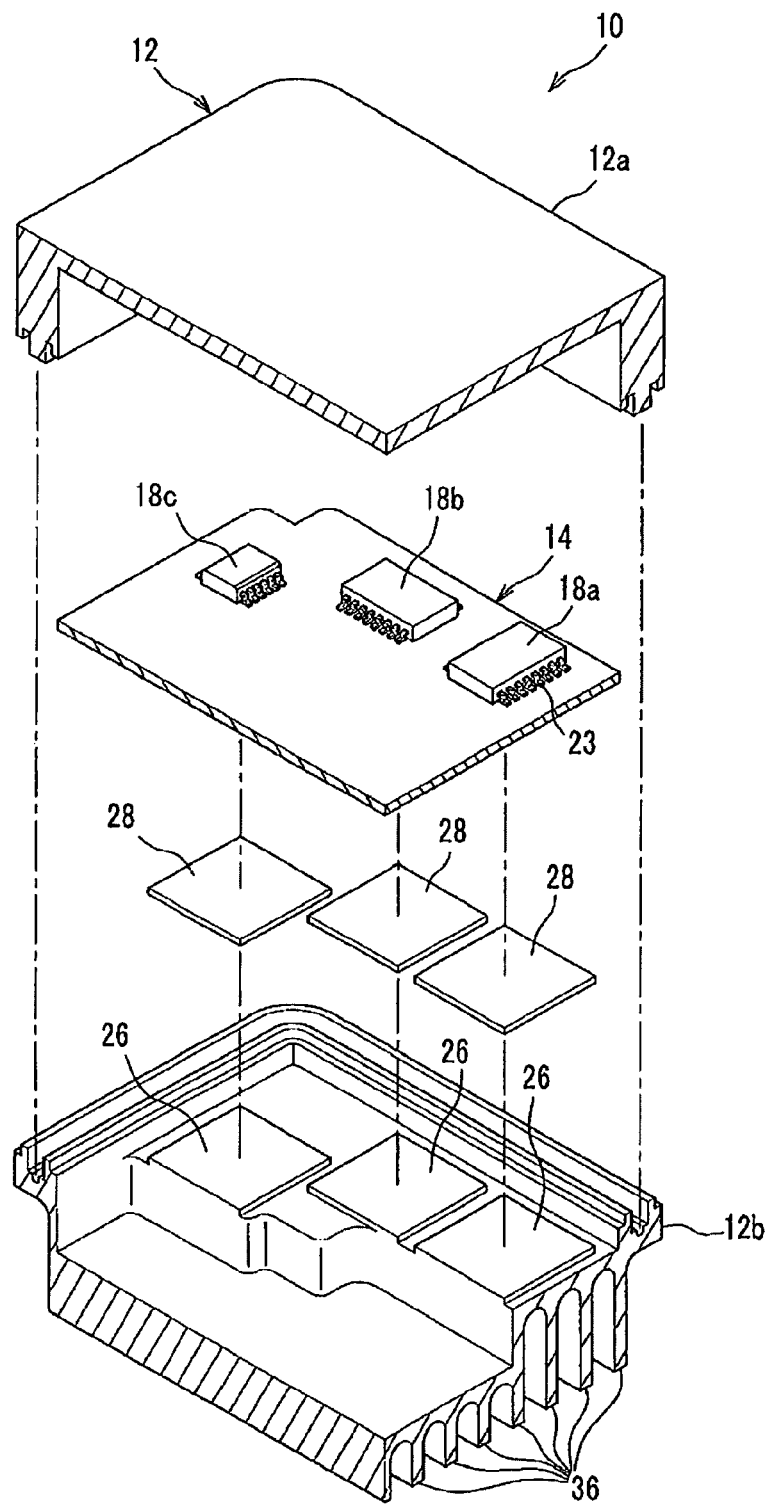
FIG. 1 is an exploded isometric sectional view of a portion of an electronic control unit showing the heat dissipation structure of the print circuit board in accordance with an embodiment of the present invention.
Figure 2:
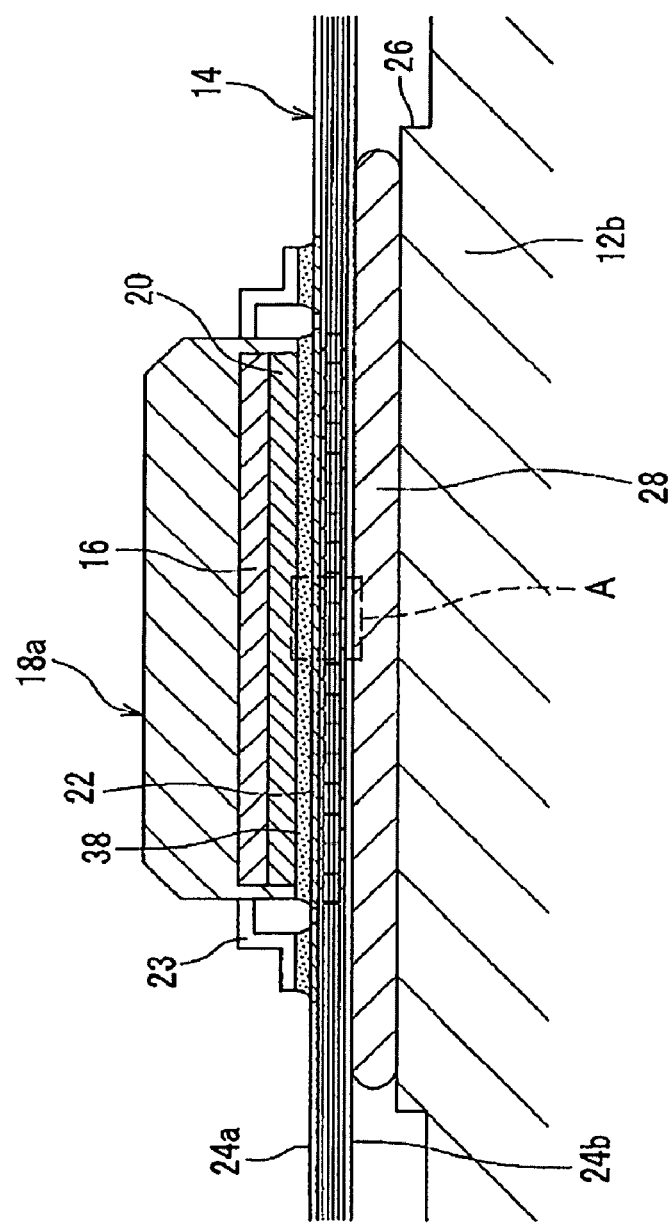
FIG. 2 is an enlarged sectional view, partially abbreviated, showing a portion of the print circuit board of the FIG. 1.
Figure 3:
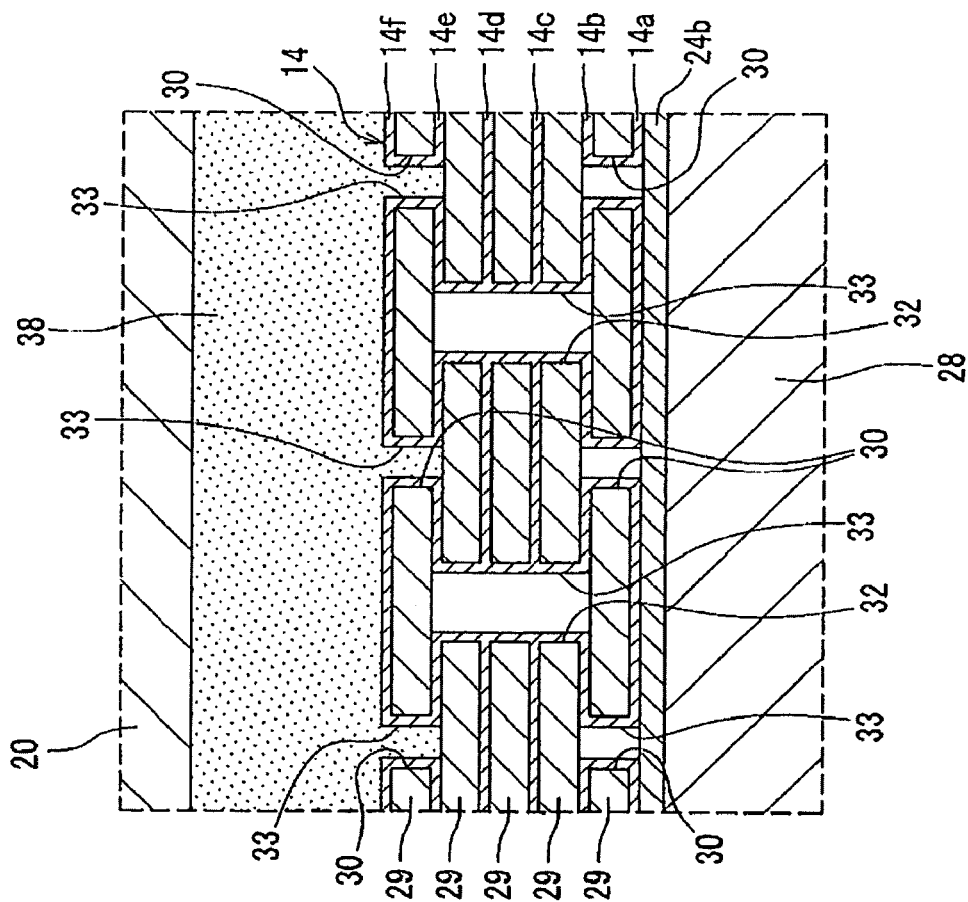
FIG. 3 is an enlarged vertical cross sectional view of the print circuit board of A section in FIG. 2.

The best embodiment form of the present invention will be described in detail with reference to the accompanying drawings. FIG. 1 is an exploded isometric sectional view of a portion of an electronic control unit showing the heat dissipation structure of the print circuit board in accordance with the embodiment of the present invention. FIG. 2 is an enlarged vertical sectional view, partially abbreviated, showing the print circuit board of the FIG. 1. FIG. 3 is an enlarged cross sectional view of the print circuit board of the section A in FIG. 2.

As shown in FIG. 1, the electronic control unit 10 comprises an enclosure 12 which consists of an upper case 12a and a lower case 12b, both of which are molds of metal material like aluminum for example, and a print circuit board 14, also called a print-circuit substrate, which is installed within an inner space of the enclosure 12. It is desirable that the enclosure 12 is made of aluminum mold because the enclosure serves as a heat sink as well.

As shown in FIG. 2, on the upper surface of the print circuit board 14, a plurality of electronic components including such heat generating components 18a to 18c as integrated circuits chips (IC), transistors, Field Effect Transistors (FET) having the heat source element 16, resistors and capacitors (not illustrated) are mounted. Only the heat generating components 18a to 18c having the heat source element 16 (please refer to FIG. 2) are illustrated in FIG. 1, illustration of other component types are abbreviated.

As shown in FIG. 2, between the heat source element 16 and the print circuit board 14, a multilayer structure is built downward consisting of a back side electrode 20 to which the heat is conducted from the heat source element 16, a cream solder 38, a copper foil pattern 22, and a plurality of connection terminals 23 of the heat generating components 18a to 18c which are connected to the print circuit board 14 electrically. Further, the upper surface of the print circuit board 14 excluding the areas of the copper foil pattern 22 is covered with a first solder resist film 24a formed by a resist process of applying a solder resist coating.

The lower surface of the print circuit board 14 is covered with a second resist film 24b formed by a resist process of a solder resist coating. Further, onto the second resist film 24b, a heat dissipation sheet 28 which is made of flexible high thermal conductivity material is disposed to make a direct surface contact at a position facing the rectangular flat-top boss 26 (refer to FIG. 1) of the lower case 12b.

The print circuit board 14, as shown in FIG. 3, comprises a plurality of insulation plates 29 which are stacked. Each of the insulation plates 29 has a copper foil pattern on both or either of its surface and is made of an electrically non-conductive material such as glass fiber reinforced epoxy resin, There are 5 of such insulation plates 29 used in this embodiment. There is a layer (one of layers 14a to 14f) formed between each adjacent insulation layer 29 and the layers 14a to 14f are stacked in this order sequentially with the layer 14a disposed as the lower most first layer closest to the heat dissipation sheet 28 and the layer 14f as the uppermost sixth layer. There are a plurality of inner vias 30 and a plurality of core vias 32 both formed in the print circuit board 14. Each of the inner vias 30 communicates with either the upper surface or the lower surface of the print circuit board 14 and is not bored through between the upper surface and the lower surface of the print circuit board 14. Each of the core vias 32 is disposed a predetermined length apart from the inner via 30 on the copper foil pattern 22, does not communicate with any of the upper surface and the lower surface of the print circuit board 14 and is not bored through between the upper surface and the lower surface of the print circuit board 14. The inner walls of both inner vias 30 and the core vias 32 are covered by a conductor 33 which is made of an electrically conductive material layer such as a plated copper layer by metal plating process. In FIG. 3, illustration of the resin 34 filling the core via 32 is skipped for brevity.

This embodiment of the invention is described using an exemplary print circuit board 14 having six layers of copper foil pattern of the first layer 14a through the sixth layer 14f. The print circuit board is not limited to the six layer board, any multilayer print circuit board with a plurality multiple various wiring layers may be used.

As shown in FIG. 3, inner vias 30 are bored through in the stacking direction between the first layer 14a and the second layer 14b, both of which are a copper foil pattern 22 in the print circuit board 14 and these inner vias 30 are disposed on the lower surface of the print circuit board 14, while core vias 32 are bored through in the stacking direction between the second layer 14b and the fifth layer 14e and are disposed a predetermined length apart from the inner via 30 on the copper foil pattern 22 of the second layer 14b. In addition, the other inner vias 30 are bored through in the stacking direction between the fifth layer 14e and the sixth layer 14f and disposed on the upper surface of the print circuit board 14 and coaxially with the inner vias on the lower surface of the print circuit board 14.

In other words, the inner via 30 is disposed under the heat generating components 18a to 18c and bored through from on either the upper or lower surface of the print circuit board 14 between the outer layers of the first layer 14a and the second layer 14b or between the outer layers of the fifth layer 14e and the sixth layer 14f, and are not bored between any couple of the inner layers of the second layer 14b through the fifth layer 14e. Meanwhile, the core via 32 is bored through between the inner layers from the second layer 14b to the fifth layer 14e, and are not bored between the outer layers of the first and second layer 14a,14b, or, the fifth and sixth layer 14e,14f. Additionally, the core vias are disposed in the vicinity of the inner via 30 and a predetermined length apart from the inner via 30 on a horizontal plane of the copper foil pattern 22, the stacked surface, which is vertical to the axial direction of the inner via 30 and the core via 32.

Figure 4A:
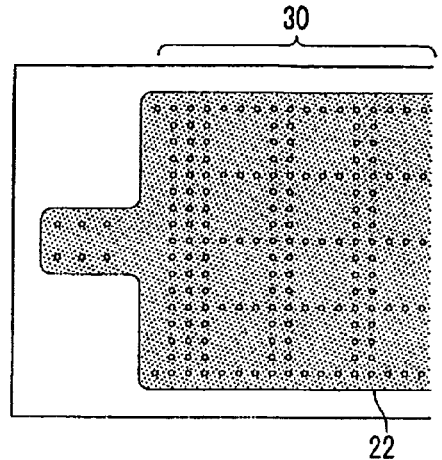
FIG. 4A through FIG. 4E are the plan view of a layout of the inner vias and the core vias in each of the layer from the first layer through the sixth layer of the print circuit board, where the layout of the third layer and fourth layer are the same.

Looking to each individual layer hereupon, a detailed description of the inner vias and the core vias is to be given as follows. As shown in FIG. 4A, the first layer 14a which is the lowermost layer, contains only a plurality of inner vias 30. These inner vias 30 are bored at a predetermined interval on the first layer 14a. The copper foil pattern 22 is made to encircle each of the inner vias 30. As shown in FIG. 4B, the second layer 14b which is stacked over the first layer 14a, contains both the inner vias 30 and the core vias 32. Each of the inner vias 30 is bored through the second layer 14b at the corresponding positions above the inner vias 30 in the first layer 14a. In the center of the substantially square area surrounded by the inner vias 30, a single core via 32 is bored with a larger diameter than the surrounding inner vias 30. A plurality of the core vias 32 are positioned at a predetermined interval on the second layer 14b. Additionally, in the second layer 14b, a copper foil pattern 22 is made to encircle both of inner vias 30 and the core vias 32.

Figure 4D:
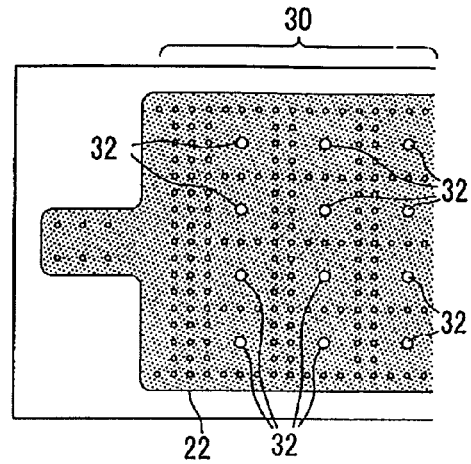
Figure 4B:
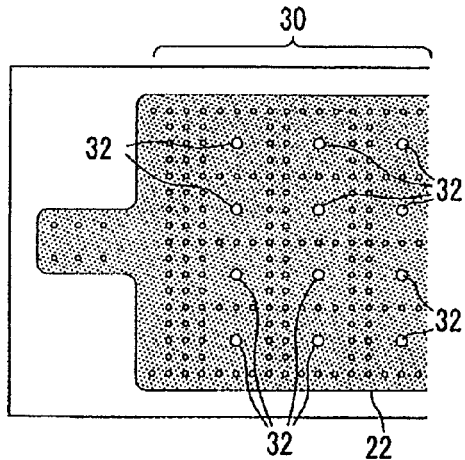
Figure 4E:
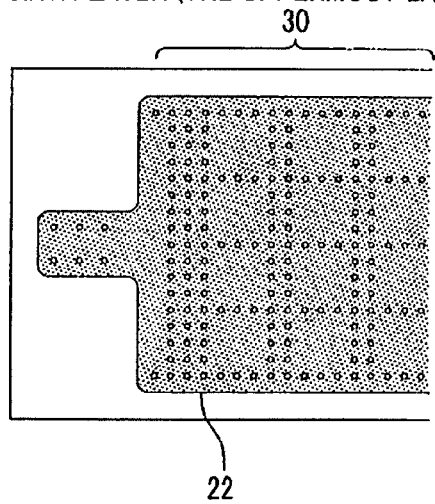
Figure 4C:
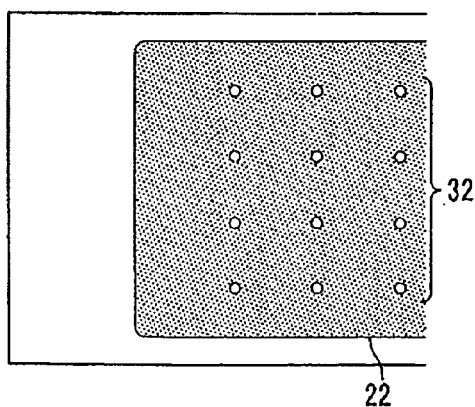

As shown in FIG. 4C, the third layer 14c and the fourth layer 14d which are stacked in sequence over the second layer 14b, share the same pattern including only a plurality of core vias 32, which are bored at a predetermined interval on each of the third layer 14c and the fourth layer 14d and communicate with the core vias 32 in the second layer 14b. The copper foil pattern 22 in each of the third layer 14c and the fourth layer 14d is made to encircle the core vias 32.

As shown in FIG. 4D, the fifth layer 14e which is stacked over the fourth layer 14d, contains both the inner vias 30 and the core vias 32. A plurality of the inner vias 30 are bored in the fifth layer 14e. In the center of the substantially square area surrounded by the inner vias 30 is bored a core via 32 which communicates with a core via 32 bored through between the third layer 14c and the fourth layer 14d. A plurality of the core vias 32 are positioned at a predetermined interval on the fifth layer 14e. Additionally, in the fifth layer 14e, a copper foil pattern is made to encircle both of the inner vias 30 and the core vias 32.

As is shown in FIG. 4E, the uppermost sixth layer 14f, which is stacked over the fifth layer 14e, contains only a plurality of the inner vias 30 which are bored at a predetermined interval on the sixth layer 14f and communicate with the inner vias 30 in the fifth layer 14e. Furthermore, in the sixth layer 14f, a copper foil pattern 22 is made to encircle the whole inner vias 30.

Each copper foil pattern 22 that constitutes a layer between adjacent layers of the first through the sixth layers, is formed only for the purpose of heat dissipation. The circuit wiring pattern connecting between the electronic components are formed on the back side surface of the print circuit board, although not described in any figure. Further, the present embodiment describes an exemplary structure in which the inner vias 30 are bored through between the outer layer 14a and the inner layer 14b and between the outer layer 14f and the inner layer 14e while the core vias 32 formed within the inner layers are bored through between the second layer 14b and the fifth layers 14e. However the structure of the inner via and the core via are not limited to the above mentioned. For instance the inner vias 30 may be bored through between three outer layers of the first layer 14a through the third layer 14c and between the outer layers of the fourth layer 14d through the sixth layer 14f, while the core vias 32 are bored through between the third layer 14c and the fourth layers 14d.

What are needed in this embodiment are inner vias which are bored through between the outer layers and not bored through between the inner layers and core vias 32 which are bored through between the inner layers and not bored through between the outer layers. The core via 32 bored through between the inner layers is filled with a resin material 34 which is hardened from melted resin flowed therein (refer to FIG. 6) and is stopped. By stopping the core via 32 with resin, a pressure increase within the core via 32 is prevented properly when the heat is transferred from the heat generating components 18a to 18c.

As shown in FIG. 1, at the bottom of the lower case 12b of the housing 12, heat-dissipation fins 36 are formed with protruding portions and recessed portions which are alternatingly formed. As described hereinafter, heat from the heat generating components 18a to 18c is dissipated through the heat-dissipation fins 36 to the outside.

The electronic control unit 10, to which the heat dissipation structure of the print circuit board is applied in accordance with the present invention, is basically constructed as described hereinbefore. The operation and effect of the embodiment will be described hereinafter.

Firstly, the mounting process of the heat generating components 18a to 18c with solder cream 38 on the print circuit board 14 is described. The solder cream 38 is a mixture of solder particles, solvent, and flux which are intensively mixed.

Summary of an exemplary component mounting process is described hereupon. A machine robot (not illustrated) pastes, or a solder paste printing machine applies a prescribed amount of solder cream 38 on each of the predetermined spots on the mounting surface of the print circuit board 14, which is a raw print circuit board having no electronic components mounted yet. Then the print circuit board 14 is processed by a chip mounting machine (not illustrated) to receive electronic components including the heat generating components 18a to 18c onto the mounting surface. After being heated in a reflow soldering furnace (not illustrated) for soldering, the print circuit board 14 which has all the required components soldered becomes a finished product.

Figure 5A:
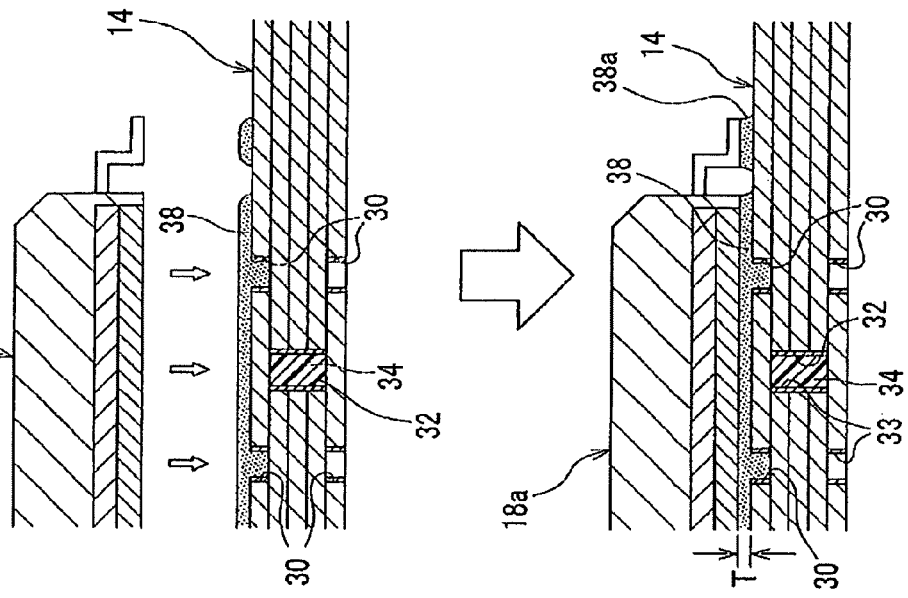
FIG. 5A is a vertical cross sectional view of the print circuit board which is of the known art showing how cream solder is coated and the electronic components are mounted.
Figure 5A:
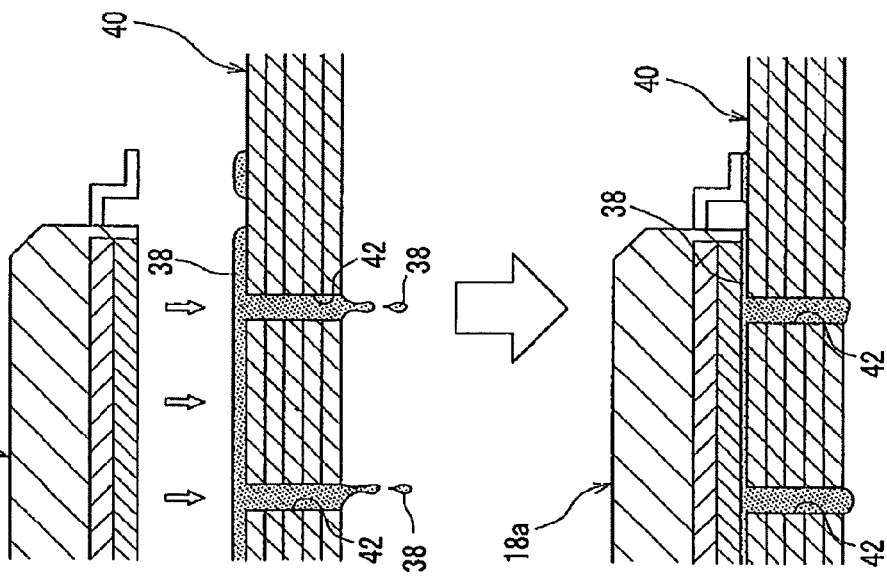

During the circuit board mounting process, as shown in FIG. 5A of known art, a print circuit board 40, which is structured to have only a plurality of through holes 42 bored through between the upper and lower surfaces, has a problem that the cream solder 38 which is applied on the mounting surface of the print circuit board 40 melts and flows out of the bottom opening of the through hole 42.

As a result, with the print circuit board structure of the known art, there is a possibility that the required solder quantity on a mounting surface of circuit board is not retained, thus it is possible to have a defective electrical connection between electronic components including the heat generating components 18a to 18c and a cracked solder layer.

According to the embodiment as shown in FIG. 5B, the cream solder 38 which is applied to the mounting surface of the print circuit board 14 flows into the inner vias 30, stays on the surface of the stacked layer and is prevented from flowing out by the bottom of the inner vias. Thus, prevention of solder spilling from the mounting surface is ensured satisfactorily.

As a result, in the present embodiment, the required solder quantity on the mounting surface of circuit board 14 to ensure the firm electrical connection of electronic components including the heat generating components 18a to 18c is kept and the hardened solder is as thick as T which is required, thus the durability against solder cracks is increased.

The thermal conduction path of heat from heat generating components 18a to 18c will be described hereinafter with reference to FIG. 6.

The heat generated by a heat source element 16 within each of the heat generating components 18a to 18c through which electricity is made to flow from a power supply (not illustrated), is transferred to the back side electrode 20. The heat is then transferred to the solder layer 38a and the copper foil pattern 22 in the sixth layer 14f, all of which are electrically connected to the back side electrode 20. The heat is further transferred to the inner vias 30 which are bored from on the upper surface of the print circuit board 14 and are filled with solder of cream solder 38.

The heat transferred to the inner vias 30 which are filled with solder of solder cream 38, is further transferred through the copper foil pattern 22 of the fifth layer 14e, to the conductor 33 on the inner walls of the core vias 32 which are disposed in the vicinity of the inner vias. The heat is transferred through the conductor 33 on the inner wall of the core vias 30 in the direction of the via hole axis, then onto the copper foil pattern 22 in the second layer 14b. The heat is further transferred onto the conductor 33 on the inner walls of the inner vias 30 which are bored from on the lower surface of the print circuit board 14 and disposed in the vicinity of the core vias 32.

The heat transferred to the inner vias 30 on the lowermost surface, is still further transferred to the heat-dissipation sheet 28 via the second resist film 24b, then onto the lower case 12b of the metal enclosure 12. The heat is dissipated via the heat dissipation fins 36 to the outside.

According to this embodiment, the heat generated in the heat generating components 18a to 18c is transferred well through the inner vias 30 bored through between the outer layers and the core vias 32 bored through between the inner layers inside the circuit board 14 to the outside, thus the heat-dissipation efficiency is improved.

As a result, the embodiment of the present invention provides both retention of soldering strength and improvement of heat-dissipation efficiency for the mounted electronic components including the heat generating components 18a to 18c.

Figure 6:
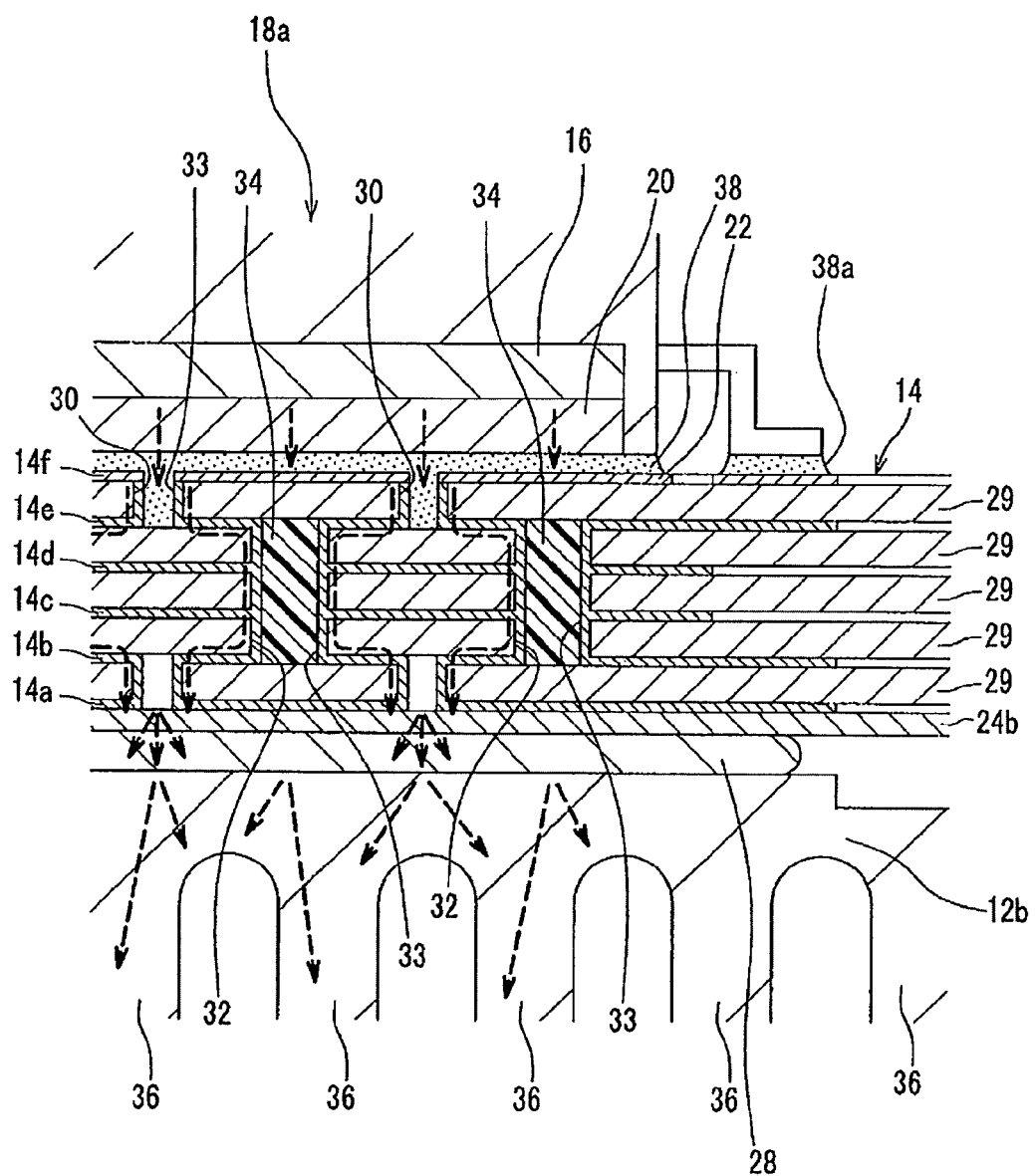
FIG. 6 is a vertical cross sectional view of the heat dissipation structure of print circuit board in accordance with the present embodiment, showing the thermal conduction path of heat from the heat generating components.

In addition, the embodiment has a heat dissipation property of spreading downward as shown by the arrows in FIG. 6. The heat transfer path from each of the heat generating components 18a to 18c spreads at the lower part. This brings a beneficial effect that the dimension of the heat-dissipation sheet 28 contacting the print circuit board 14 can be minimized.

What is claimed is:

1. A heat dissipation structure of a print circuit board, comprising
    a print circuit board comprising a plurality of stacked layers constituted by a plurality of outer layers, the outer layers including an uppermost layer and a lower most layer, and a plurality of inner layers, the inner layers disposed between the outer layers, and
    electronic components including a heat generating component, which are mounted on the outer layer,
    wherein an inner via and a core via are formed in the print circuit board, the inner via which is bored through between the outer layers and not bored through between the inner layers, the core via which is bored through between the inner layers and not bored through between the outer layers, and
    wherein the core via is disposed a predetermined length apart from the inner via on the stacked layer.

2. The heat dissipation structure of a print circuit board according to claim 1,
    wherein the electronic components and the print circuit board are connected electrically with solder,
    the solder flows into the inner via which is bored through the outer layer of the print circuit board and stops flowing in the inner via.

* * * * *